(12) United States Patent
Lee

(10) Patent No.: US 12,041,735 B2
(45) Date of Patent: Jul. 16, 2024

(54) FOLDABLE DISPLAY APPARATUS

(71) Applicant: LG DISPLAY CO., LTD., Seoul (KR)

(72) Inventor: Hyeonyeong Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 26 days.

(21) Appl. No.: 17/897,826

(22) Filed: Aug. 29, 2022

(65) Prior Publication Data

US 2023/0080858 A1 Mar. 16, 2023

(30) Foreign Application Priority Data

Sep. 13, 2021 (KR) .......................... 10-2021-0121449

(51) Int. Cl.
*H05K 5/00* (2006.01)
*H05K 5/02* (2006.01)

(52) U.S. Cl.
CPC ..................... *H05K 5/02* (2013.01)

(58) Field of Classification Search
None
See application file for complete search history.

(56) References Cited

U.S. PATENT DOCUMENTS

| | | | |
|---|---|---|---|
| 9,353,293 B2 | 5/2016 | Niimi et al. | |
| 9,911,793 B2 | 3/2018 | Lee et al. | |
| 10,796,125 B2 | 10/2020 | Gong et al. | |
| 2011/0307102 A1* | 12/2011 | Czamara | H05K 7/20836 |
| | | | 700/282 |
| 2011/0316337 A1* | 12/2011 | Pelio | H05K 7/1492 |
| | | | 307/24 |
| 2012/0092811 A1* | 4/2012 | Chapel | G06F 11/3006 |
| | | | 361/622 |
| 2016/0021793 A1* | 1/2016 | Chen | H05K 7/202 |
| | | | 361/679.02 |
| 2017/0013745 A1* | 1/2017 | Wilcox | H05K 7/20745 |
| 2017/0359917 A1* | 12/2017 | Bailey | H05K 7/1485 |
| 2019/0171799 A1* | 6/2019 | Crawford | H05K 7/2079 |
| 2019/0261534 A1* | 8/2019 | Jochim | H05K 7/20781 |
| 2020/0146186 A1* | 5/2020 | Fotouh | E04B 2/7401 |

(Continued)

FOREIGN PATENT DOCUMENTS

| KR | 10-2017-0036190 A | 4/2017 |
|---|---|---|
| KR | 10-1774209 B1 | 9/2017 |
| KR | 10-2019-0078960 A | 7/2019 |

*Primary Examiner* — Anthony Q Edwards
*Assistant Examiner* — Rashen E Morrison
(74) *Attorney, Agent, or Firm* — Morgan, Lewis & Bockius LLP

(57) ABSTRACT

A foldable display apparatus includes a display panel; a first plate under the display panel; and a support structure under the first plate and having a foldable area and two non-foldable areas respectively on both opposing sides of the foldable area. The support structure includes a first support plate having a plurality of opening patterns defined in the foldable area; a second support plate above the first support plate and including a material different from a material of the first support plate; and a first adhesive layer between the first support plate and the second support plate. The first adhesive layer has: first portions respectively in each of the non-foldable areas of the support structure; and a second portion in the foldable area of the support structure. The second portion has a higher degree of cure than a degree of cure of each of the first portions.

20 Claims, 5 Drawing Sheets

(56) References Cited

U.S. PATENT DOCUMENTS

| | | | |
|---|---|---|---|
| 2021/0076529 A1* | 3/2021 | Pachoud | G06F 11/3058 |
| 2021/0200276 A1* | 7/2021 | Lee | G06F 1/1616 |
| 2021/0219460 A1* | 7/2021 | Bailey | H05K 7/20754 |
| 2022/0075411 A1* | 3/2022 | Lee | G06F 1/1616 |

* cited by examiner

FOLDABLE DISPLAY APPARATUS

CROSS-REFERENCE TO RELATED APPLICATION

This application claims priority from Korean Patent Application No. 10-2021-0121449 filed on Sep. 13, 2021, in the Korean Intellectual Property Office, and all the benefits accruing therefrom under 35 U.S.C. 119, the contents of which in its entirety are herein incorporated by reference.

BACKGROUND

Technical Field

The present disclosure relates to a foldable display apparatus, and more particularly, to a foldable display apparatus that may reduce display quality defects due to opening patterns of a support structure.

Discussion of the Related Art

As society enters a full-fledged information age, various display apparatuses that process and display a large amount of information have been developed. There are various types of display apparatuses that display images, such as a liquid crystal display apparatus (LCD), an organic light-emitting display apparatus (OLED), and an electrophoretic display apparatus (EPD).

Users who watch broadcasts, videos, or play video games on a display apparatus tend to prefer a portable display apparatus with a large screen. However, when the screen of the portable display apparatus is enlarged, portability thereof is deteriorated. Thus, there is a limit to enlargement of the screen. Research on a foldable display apparatus that may fold and unfold the display panel, which would enable both a large screen and portability, has being actively conducted.

SUMMARY

In the foldable display apparatus, a flexible substrate of a display panel is very thin. Thus, a back plate that may support the display panel may be attached to a bottom surface of the display panel. For example, the back plate may be made of a polymer film, and may be attached to the display panel via an adhesive layer. When folding and unfolding operations of the foldable display apparatus are repeated, plastic deformation occurs in the back plate made of the polymer film in a foldable area. This causes a problem in that the folding characteristics of the foldable display apparatus may be deteriorated. To compensate for this deterioration, a high-stiffness support structure is attached to the bottom surface of the back plate. The support structure includes a high-stiffness metal plate with a thin thickness. The high-stiffness metal plate has high restoring force. However, an elastic deformation region thereof is narrow. Thus, opening patterns are formed in the foldable area to enlarge the elastic deformation region of the metal plate. In this regard, there is a problem in that a step caused by the opening patterns formed in the support structure is transferred to a display surface of the display apparatus, resulting in poor display quality.

Accordingly, embodiments of the present disclosure are directed to a foldable display apparatus that substantially obviates one or more of the problems due to limitations and disadvantages of the related art.

An aspect of the present disclosure is to provide a foldable display apparatus that has excellent folding characteristics and may reduce display quality defects due to opening patterns of the support structure.

Further, an aspect of the present disclosure is to provide a foldable display apparatus in which puncture strength may be improved.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

According to an embodiment of the present disclosure, a foldable display apparatus comprises a display panel; a first plate under the display panel; and a support structure under the first plate and having a foldable area and two non-foldable areas respectively on both opposing sides of the foldable area, wherein the support structure includes a first support plate having a plurality of opening patterns defined in the foldable area of the support structure; a second support plate above the first support plate and including a material different from a material of the first support plate; and a first adhesive layer between the first support plate and the second support plate, wherein the first adhesive layer of the support structure has first portions respectively in each of the two non-foldable areas of the support structure; and a second portion in the foldable area of the support structure, wherein the second portion has a higher degree of cure than a degree of cure of each of the first portions.

In another aspect, a foldable display apparatus comprises a display panel; and a plate assembly under the display panel, wherein the plate assembly includes an upper plate, a lower plate under the upper plate, and a first adhesive layer between the upper plate and the lower plate, wherein the lower plate has a plurality of opening patterns defined therein, wherein the first adhesive layer covers the plurality of opening patterns, and has different portions having different moduli.

In another aspect, a foldable display apparatus comprises a display panel; a first plate under the display panel; and a support structure under the first plate and having a foldable area and two non-foldable areas respectively on both opposing sides of the foldable area, wherein the support structure includes a first support plate having a plurality of opening patterns defined in the foldable area of the support structure; a second support plate above the first support plate and including a material different from a material of the first support plate; and a first adhesive layer, wherein the first adhesive layer is a single curable type adhesive layer between the first support plate and the second support plate, wherein the first adhesive layer has: first portions respectively in each of the two non-foldable areas of the support structure; and a second portion in the foldable area of the support structure, wherein the second portion has a higher degree of cure than a degree of cure of each of the first portions, wherein the first portions and the second portion of the first adhesive layer are first cured under light and then only the second portion is further cured under light.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are

DETAILED DESCRIPTION

Figure 1:
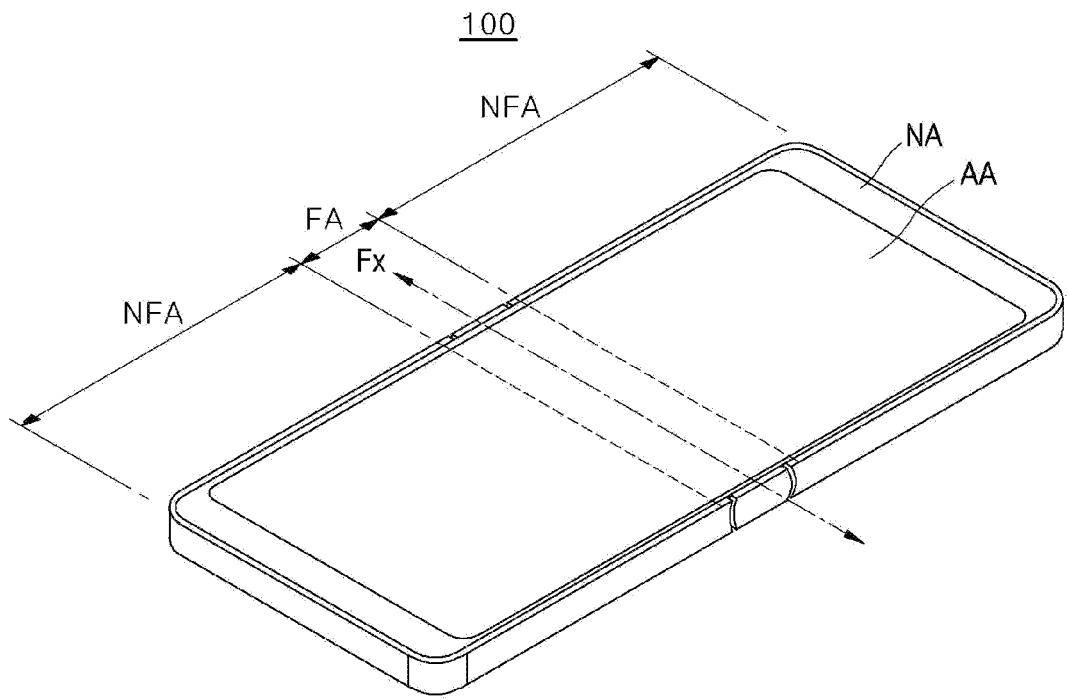
FIG. 1 is a perspective view showing a display apparatus according to an example embodiment of the present disclosure.

Reference will now be made in detail to embodiments of the present disclosure, examples of which may be illustrated in the accompanying drawings. In the following description, a detailed description of functions or configurations related to this document that are well-known to those skilled in the art may be omitted. The progression of processing steps and/or operations described is an example. The sequence of steps and/or operations is not limited to that set forth herein and may be changed as is known in the art or apparent to those skilled in the art, with the exception of steps and/or operations necessarily occurring in a particular order. Names of the respective elements used in the following explanations are selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of the claims.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. In a case where terms "comprise," "have," and "include" described in the present specification are used, another part may be added unless a more limiting term, such as "only," is used. The terms of a singular form may include plural forms unless referred to the contrary. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, foldable display apparatuses according to embodiments according to the present disclosure will be described in detail with reference to the accompanying drawings.

FIG. 1 is a perspective view showing a foldable display apparatus according to an example embodiment of the present disclosure.

With reference to FIG. 1, a foldable display apparatus 100 may include a display area AA, a non-display area NA, a foldable area FA, and a non-foldable area NFA. The display area AA may be an area where an image is displayed. The non-display area NA is located at a periphery of the display area AA, and may be an area where no image is displayed.

The foldable area FA may include a folding axis Fx and may overlap a portion of the display area AA and a portion of the non-display area NA. For example, the foldable area FA may be an area foldable at a predefined curvature when the foldable display apparatus 100 is folded in at least one scheme of an inner folding and outer folding schemes. An area other than the foldable area FA may be a non-foldable area NFA. The non-foldable area NFA may overlap a portion of the display area AA and a portion of the non-display area NA.

Moreover, the foldable display apparatus 100 may further include a hinge structure for folding the display panel, etc., and a casing for supporting and accommodating the display panel, etc. The foldable area FA and the non-foldable area NFA may be equally applied to components of the foldable display apparatus 100.

Figure 2:
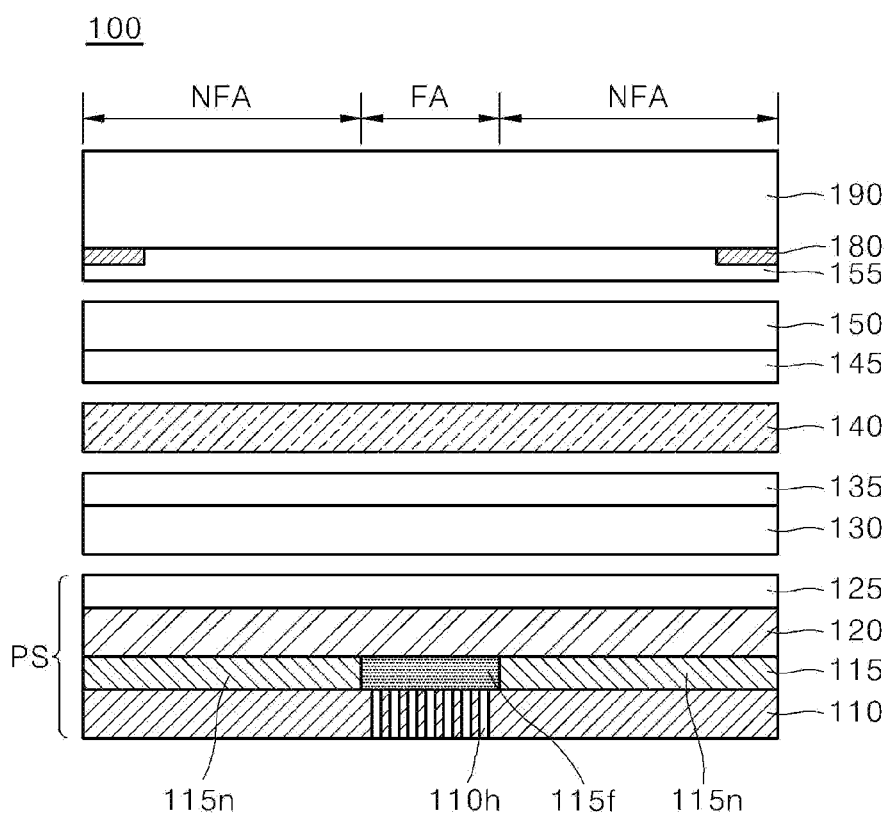
FIG. 2 is a cross-sectional view showing a display apparatus according to an example embodiment of the present disclosure.
Figure 3:
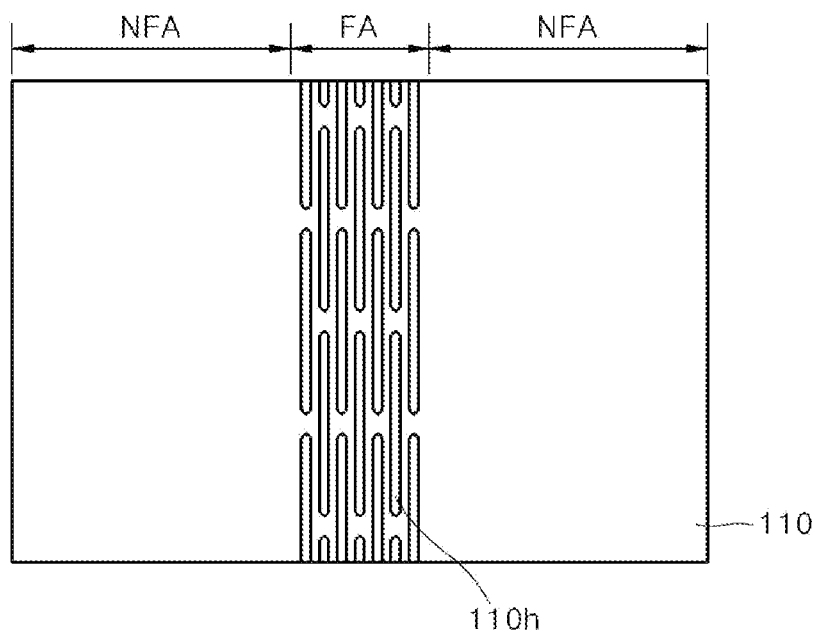
FIG. 3 is a plan view showing a first support plate included in a support structure according to an example embodiment of the present disclosure.
Figure 4:
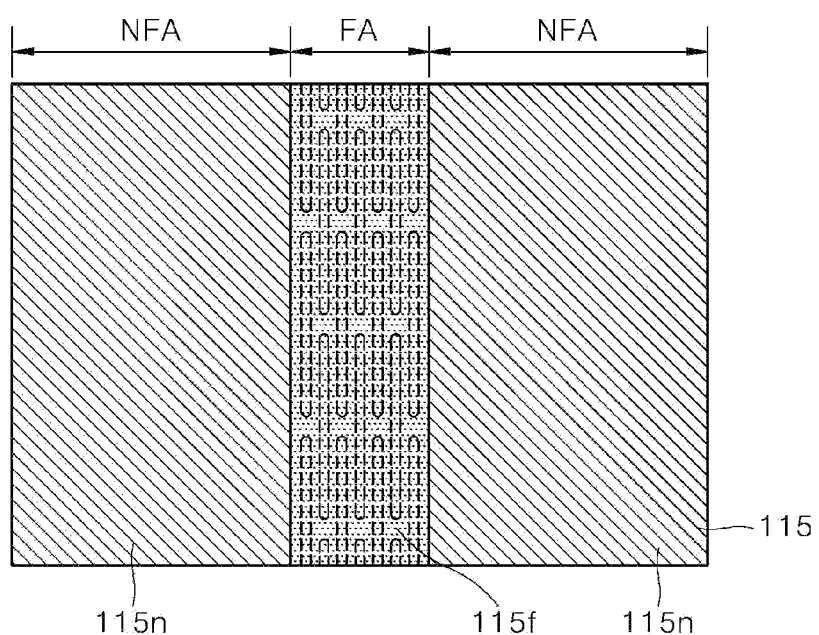
FIG. 4 is a plan view showing an adhesive layer included in a support structure and disposed on a first support plate according to an example embodiment of the present disclosure.

FIG. 2 is a cross-sectional view showing a foldable display apparatus according to an example embodiment of the present disclosure. FIG. 3 is a plan view showing a first support plate included in a support structure according to an example embodiment of the present disclosure. FIG. 4 is a plan view showing an adhesive layer included in a support structure and disposed on a first support plate according to an embodiment of the present disclosure.

With reference to FIG. 2, the foldable display apparatus 100 may include a support structure PS, a first plate 130, a display panel 140, a polarizing layer 150, a light-blocking layer 180, and a cover window 190.

The display panel 140 may display an image. The display panel 140 may be flexible and may display an image to a user. For example, the display panel 140 may be embodied as an organic light-emitting display panel. However, the disclosure is not limited thereto. The display panel 140 may be of various types, for example, a liquid crystal display panel, an electrophoretic display panel, and the like. When the display panel 140 is embodied as an organic light-emitting display panel, the display panel 140 may include a thin-film transistor array formed on a substrate and including thin-film transistors (switching thin-film transistors and driving thin-film transistors) corresponding to sub-pixels, an organic light-emitting layer having organic light-emitting elements corresponding to sub-pixels and connected to the driving thin-film transistors respectively, and an encapsulation layer that covers the organic light-emitting layer to prevent penetration of moisture and oxygen from the outside into the organic light-emitting layer. A touch electrode array formed on the encapsulation layer may be further included. In another example, a touch panel including a touch electrode array may be formed on the polarizing layer 150.

The first plate 130 may be disposed below the display panel 140 and may support the display panel 140. The display panel 140 applied to the foldable display apparatus 100 may be very thin and flexible. The first plate 130 reinforces the rigidity of the display panel 140, prevents foreign material from adhering to the bottom surface of the display panel 140, and cushions the impact from the outside. The first plate 130 may be made of, for example, polyethylene terephthalate (PET), polycarbonate (PC), polyethylene naphthalate (PEN), or metal. However, the disclosure is not limited thereto. The adhesive layer 135 may be disposed between the first plate 130 and the display panel 140. For example, the first plate 130 may be attached to the bottom surface of the display panel 140 via an adhesive layer 135. The first plate 130 may be a back plate. The present disclosure is not limited to the term.

The support structure PS may be placed under the first plate 130, and may support the display panel 140. The support structure PS may facilitate folding and unfolding of the display panel 140. The support structure PS may dissipate the heat generated from the display panel 140 to the outside. The support structure PS may include the foldable area FA and the non-foldable areas NFA on each of both opposing sides of the foldable area FA. The support structure PS may include at least one support plate. The support structure PS may include a first support plate 110 and a second support plate 120. The support structure PS may further include an adhesive layer 115 disposed between the first support plate 110 and the second support plate 120. The support structure PS may further include an adhesive layer 125, and may be attached to the bottom surface of the first plate 130 via the adhesive layer 125. For example, the adhesive layer 125 may be disposed between the first plate 130 and the support structure PS. For example, the support structure PS may be a plate assembly.

The first support plate 110 may have a plurality of opening patterns 110h defined in the foldable area FA thereof. With reference to FIG. 3, the plurality of opening patterns 110h may extend in a direction parallel to the folding axis (hereinafter, referred to as a folding-axis direction), and may be provided in a discontinuous form. A length of each of the plurality of opening patterns 110h may be smaller than a width in the folding-axis direction of the first support plate 110. A shape and an arrangement scheme of the plurality of opening patterns 110h are not limited to those shown. Spacings between opening patterns 110h adjacent to each other in the direction perpendicular to the folding axis Fx may be uniform. However, the disclosure is not limited thereto. The spacings between opening patterns 110h adjacent to each other in the direction perpendicular to the folding axis Fx may increase as the patterns are located away from the folding axis Fx. A first spacing between the opening patterns 110h adjacent to each other in the direction perpendicular to the folding axis Fx in a central portion adjacent to the folding axis Fx may be smaller than a second spacing between the opening patterns 110h adjacent to each other in the direction perpendicular to the folding axis Fx in an edge portion on either side of the central portion.

The second support plate 120 may be disposed on the first support plate 110. The second support plate 120 may be made of a different material from that of the first support plate 110. For example, the first support plate 110 may be made of metal with excellent thermal conductivity. For example, the first support plate 110 may be made of stainless steel. The second support plate 120 may be made of a polymer that blocks UV rays. For example, the second support plate 120 may be made of black polyethylene terephthalate (PET). The first support plate 110 may act as a lower plate, and the second support plate 120 may act as an upper plate.

The adhesive layer 115 may be configured to have different modulus in the non-foldable area NFA and the foldable area FA thereof. For example, the adhesive layer 115 may have first portions 115n respectively disposed in the non-foldable areas NFA, and a second portion 115f disposed in the foldable area FA. The second portion 115f may have a greater modulus than each of the first portions 115n. In this regard, the modulus may be a storage modulus or Young's modulus. The second portion 115f may have a modulus of approximately $10^6$ to $10^7$ Pa, while the first portion 115n may have a modulus of approximately $10^4$ to $10^5$ Pa.

With reference to FIG. 4, the second portion 115f of the adhesive layer 115 may cover the plurality of opening patterns 110h of the first support plate 110. For example, the second portion 115f of the adhesive layer 115 may cover all of the plurality of opening patterns 110h of the first support plate 110. The second portion 115f may be disposed throughout the foldable area FA and as a single body. The adhesive layer 115 may be transparent or include black pigment.

The adhesive layer 115 may be configured to have different degree of cure in the non-foldable areas NFA and the foldable area FA thereof. For example, the adhesive layer 115 may have the first portions 115n disposed in the non-foldable areas NFA and the second portion 115f disposed in the foldable area FA and having a higher degree of cure than that of the first portions 115n.

At least two curing processes may be performed so that the adhesive layer 115 has different degree of cure in the non-foldable areas NFA and the foldable area FA. The adhesive layer 115 may be a single curable type adhesive layer, for example, a light curable type adhesive layer, for example, an ultraviolet curable type adhesive layer. Each of the first portions 115n of the adhesive layer 115 may be first cured under light, for example, UV, and then the second portion 115f of the adhesive layer 115 may be further cured under light, for example, UV. To this end, an entirety of the adhesive layer 115 including the first portions 115n and the second portion 115f may be first cured under light and then only the second portion 115f may be further cured under light using a light blocking mask covering the first portions 115n. In this way, the adhesive layer 115 having the second portion 115f having a higher degree of cure than that of each of the first portions 115n may be manufactured. When a composition for forming the adhesive layer 115 includes one type of photo-initiator, the method may include irradiating ultraviolet rays to the first portion 115n for a first time duration, and irradiating ultraviolet rays to the second portion 115f for a second time duration larger than the first time duration. In this manner, the adhesive layer 115 having the second portion 115f having a higher degree of cure than that of each of the first portions 115n may be manufactured. In contrast, the composition for forming the adhesive layer 115 includes two different types of photo-initiators having different absorption wavelengths, for example, a short-wavelength photo-initiator that absorbs ultraviolet rays of a short wavelength of 250 nm or smaller and a long-wavelength photo-initiator that absorbs ultraviolet rays of a long wavelength of 300 nm or larger. In this case, the method may include irradiating only short-wavelength or long-wavelength ultraviolet light to the first portion 115n and irradiating both the short-wavelength and long-wavelength ultraviolet light to the second portion 115f. In this way, an adhesive layer 115 having the second portion 115f having a higher degree of cure than that of each of the first portions 115n may be manufactured. The degree of cure of the second portion 115f may be approximately 76% to 90%, and the degree of cure of each of the first portions 115n may be approximately 68% to 75%.

In another example embodiment of the present disclosure, the adhesive layer 115 may be a double curable type adhesive layer. The adhesive layer 115 may be cured in two curing schemes selected from heat curing, light curing or moisture curing. The first portions 115n and the second portion 115f of the adhesive layer 115 may be first cured in a first curing scheme as one curing scheme among the heat curing, light curing, and moisture curing, and then, the second portion 115f may be second cured in a second curing scheme different from the first curing scheme and selected from the heat curing, light curing, and moisture curing. For example, the first portions 115n and the second portion 115f of the adhesive layer 115 may be first cured in the heat curing scheme, and then the second portion 115f may be second cured in the light curing scheme, for example, in an ultraviolet curing scheme. In this regard, the entire adhesive layer 115 including the first portions 115n and the second portion 115f may be first cured in the heat curing scheme, and then the second portion 115f may be second cured in the light curing scheme, for example, in an ultraviolet curing scheme using a light blocking mask covering the first portions. Thus, the adhesive layer 115 having the second portion 115f having a higher degree of cure than that of each the first portions 115n may be manufactured.

In an embodiment of the present disclosure, because the second support plate 120 is made of a polymer that blocks UV rays, the second light curing to form the second portion 115f of the layer 115 may be performed without change in properties of the adhesive layer 125 disposed on the top surface of the second support plate 120 during the second light curing.

When the second support plate 120 is made of steel use stainless (SUS) or polyimide polyimide (PI), the puncture strength of the foldable display apparatus is low, for example, approximately 4.0 to 4.8 kgF. Unlike related art flat display apparatus, a foldable display apparatus as described may have folding characteristics so that a thickness of a cover window thereof is much smaller than that of that of a related art flat display apparatus. Therefore, when the puncture strength of the foldable display apparatus is as low as in the above-mentioned range, bright spots may occur on the display panel even due to a small external impact, cracks may occur in the cover window, adhesive layers may be pressed, etc. Further, when the second support plate 120 includes polyimide (PI), a step caused by the plurality of opening patterns 110h of the first support plate 110 may be transferred to the display surface of the foldable display apparatus, which causes a problem in the display quality that is recognized by the user.

In the foldable display apparatus according to an embodiment of the present disclosure, the second support plate 120 of the support structure PS may include a material having excellent toughness. Accordingly, this may improve the rigidity characteristics of the foldable display apparatus. In the foldable display apparatus according to an embodiment of the present disclosure, the second support plate 120 of the support structure PS may include polyethylene terephthalate (PET), which has superior toughness, compared to stainless steel and polyimide (PI). Thus, the puncture strength may be improved to approximately 5.4 kgF. The toughness of the material refers to an amount by which a material absorbs energy while the material is plastically deformed before fracture. A total area on a stress-strain curve represents a toughness value. The high toughness of the material enables a good ability to absorb energy from external impact.

In the related art, colorless polyimide with a high glass transition temperature Tg is applied to the cover window in terms of heat resistance. Correspondingly, polyimide is used in the support structure. Thus, a neutral plane may be formed in the organic light-emitting element area of the display panel or the thin-film transistor array area thereof. However, because the foldable display apparatus has to have folding characteristics, the thickness of the cover window has to be reduced. As the number of products using touch fans increases, a need for a foldable display apparatus with high rigidity to withstand external shocks has increased.

In an example embodiment of the present disclosure, a material with excellent toughness properties, such as polyethylene terephthalate, may be used for the support structure. Thus, the puncture strength may be improved, thereby preventing the occurrence of bright spots on the display panel due to external impact, preventing defects, such as cracks in the cover window, and preventing the adhesive layers from being pressed.

In the foldable display apparatus according to an example embodiment of the present disclosure, the support structure PS may include the adhesive layer 115 disposed between the first support plate 110 and the second support plate 120 of the support structure PS, wherein the adhesive layer 115 has the second portion 115f covering the plurality of opening patterns 110h formed in the foldable area of the first support plate 110, and having a greater modulus or higher degree of cure than that of each of the first portions 115n. Thus, the foldable display apparatus may have excellent folding characteristics, and display quality defects of the foldable display apparatus due to the step caused by the opening patterns of the support structure may be suppressed.

The polarizing layer 150 may be configured to secure the visibility of the display panel 140. For example, the polarizing layer 150 may include a polarizer and a phase retardation film disposed on one surface of the polarizer. The adhesive layer 145 may be disposed between the polarizing layer 150 and the display panel 140. For example, the polarizing layer 150 may be attached to the top surface of the display panel 140 via an adhesive layer 145. The display panel 140 may include various metal materials used for thin-film transistors, wiring, electrodes, and light-emitting element layers. External light incident on the display panel 140 may be reflected from the metal materials as described above, and thus, the visibility of the foldable display apparatus 100 may be deteriorated due to the reflection of external light. Therefore, the polarizing layer 150 including the phase retardation film selectively transmits light therethrough such that reflection of external light incident on the display panel 140 may be reduced. Thus, the outdoor visibility of the foldable display apparatus 100 may be improved.

The cover window 190 may be disposed on the polarizing layer 150. The cover window 190 may include a polymer film. For example, the polymer film may be transparent. The polymer film may include, for example, polyethylene terephthalate (PET), colorless polyimide (PI), or a stack of polyethylene terephthalate (PET) and colorless polyimide (PI). The cover window 190 may further include a hard coating layer formed on the transparent polymer film. For example, the hard coating layer may be a coating layer. However, the disclosure is not limited to the term. The hard coating layer may include a transparent organic inorganic composite material, which may effectively protect the cover window 190 and reduce the deterioration of light transmittance. The cover window 190 may protect the polarizing layer 150 and the display panel 140 from external impact, moisture, and heat. An adhesive layer 155 may be disposed between the polarizing layer 150 and the cover window 190. For example, the cover window 190 may be attached to the top surface of the polarizing layer 150 via the adhesive layer 155.

The light-blocking layer 180 may be formed on an edge portion of the cover window 190. The light-blocking layer 180 may be covered with the adhesive layer 155 for attaching the cover window 190 to the polarizing layer 150. The light-blocking layer 180 may prevent the driver circuit, various wirings, and the pad of the non-display area NA of the display panel 140 from being viewed by the user. The light-blocking layer 180 may be formed in a ring shape. For example, the light-blocking layer 180 may be formed by printing black ink. However, the disclosure is not limited thereto.

Figure 5:
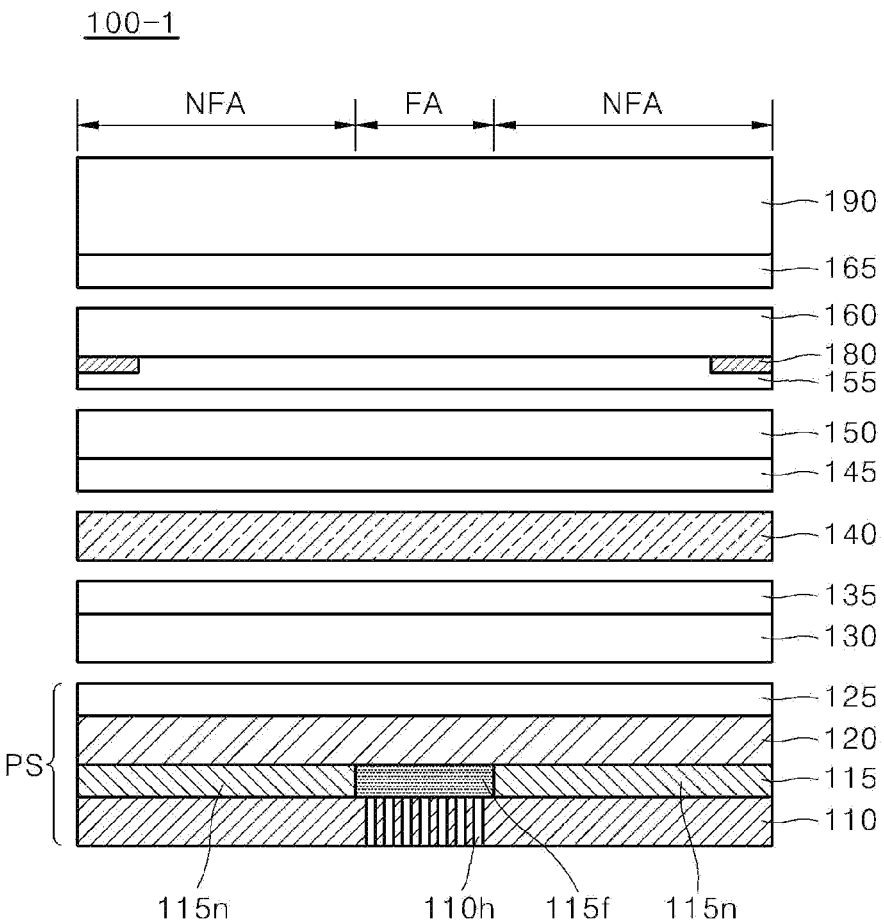
FIG. 5 is a cross-sectional view showing a display apparatus according to an example embodiment of the present disclosure.

FIG. 5 is a cross-sectional view showing a foldable display apparatus according to an example embodiment of the present disclosure.

With reference to FIG. 5, a foldable display apparatus 100-1 according to an embodiment of the present disclosure may include a protective base 160 and a light-blocking layer 180 formed on an edge of a bottom surface of the protective base 160. In an embodiment of the present disclosure, unlike the foldable display apparatus 100 of the embodiment shown in FIG. 2, the light-blocking layer 180 is not formed on the bottom surface of the cover window 190, but the light-blocking layer 180 is formed on the bottom surface of the protective base 160. For example, the protective base 160 may include a polymer film made of, for example, polyimide (PI), polyethylene terephthalate (PET), propylene glycol (PPG), and polycarbonate (PC). However, the disclosure is not limited thereto. The light-blocking layer 180 may be formed on an edge portion of the protective base 160. The adhesive layer 155 may be disposed between the protective base 160 and the polarizing layer 150. For example, the protective base 160 may be attached to the top surface of the polarizing layer 150 via the adhesive layer 155. The light-blocking layer 180 may be covered with the adhesive layer 155 for attaching the protective base 160 to the polarizing layer 150. The adhesive layer 165 may be disposed between the cover window 190 and the protective base 160. For example, the cover window 190 may be attached to a top surface of the protective base 160 via an adhesive layer 165.

Other configurations of the foldable display apparatus 100-1 and the effects thereof may be the same or similar as those of the example embodiment of FIG. 2.

FIGS. 6 to 9 are cross-sectional views showing support structures according to an example embodiment of the present disclosure, respectively.

Figure 6:
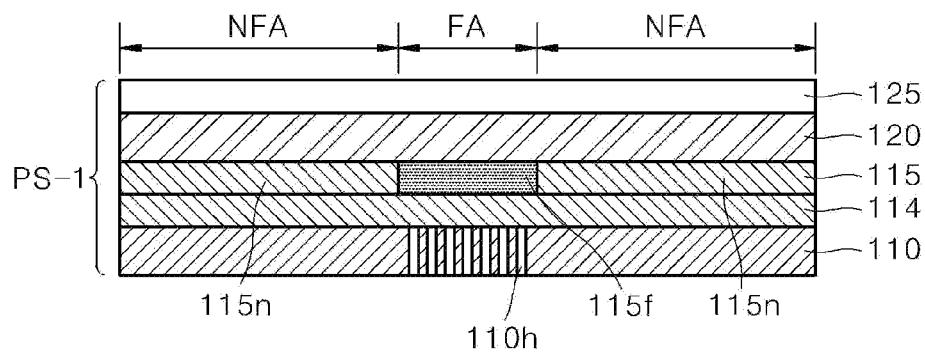
FIGS. 6 to 9 are cross-sectional views showing support structures according to an example embodiment of the present disclosure, respectively.
Figure 7:
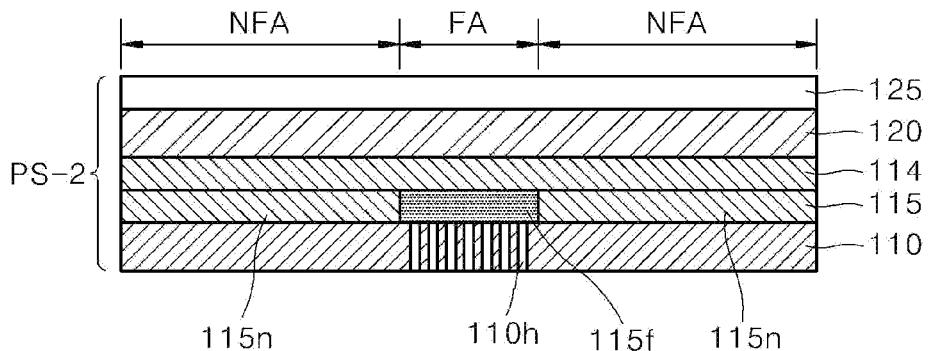

With reference to FIG. 6 and FIG. 7, a support structure PS-1 or PS-2 of the foldable display apparatus may include the first adhesive layer 115 having the first portions 115n disposed in the non-foldable areas NFA and the second portion 115f disposed in the foldable area FA and having a degree of cure higher than that of each of the first portions 115n, a second adhesive layer 114 disposed on one surface of the first adhesive layer 115 and having a uniform degree of cure. The second adhesive layer 114 may have a lower degree of cure than that of the second portion 115f of the first adhesive layer 115. The first adhesive layer 115 and the second adhesive layer 114 may be transparent or may include a black pigment. In the support structure PS-1 shown in FIG. 6, the second adhesive layer 114 may be disposed under the first adhesive layer 115. In the support structure PS-2 shown in FIG. 7, the second adhesive layer 114 may be disposed on a top surface of the first adhesive layer 115. The first adhesive layer 115 and the second adhesive layer 114 may be separately manufactured and then bonded to each other.

In the foldable display apparatus according to an embodiment of the present disclosure, the support structure PS-1 or PS-2 may include the adhesive layer 115 disposed between the first support plate 110 and the second support plate 120 of the support structure PS-1 or PS-2, wherein the layer 115 has the second portion 115f covering the plurality of opening patterns 110h formed in the foldable area of the first support plate 110, and having a greater modulus or higher degree of cure than that of each of the first portions 115n. Thus, the apparatus may have excellent folding characteristics, and display quality defects of the apparatus due to the step caused by the opening patterns of the support structure may be suppressed. Further, the puncture strength may be further improved in the foldable area.

Figure 8:
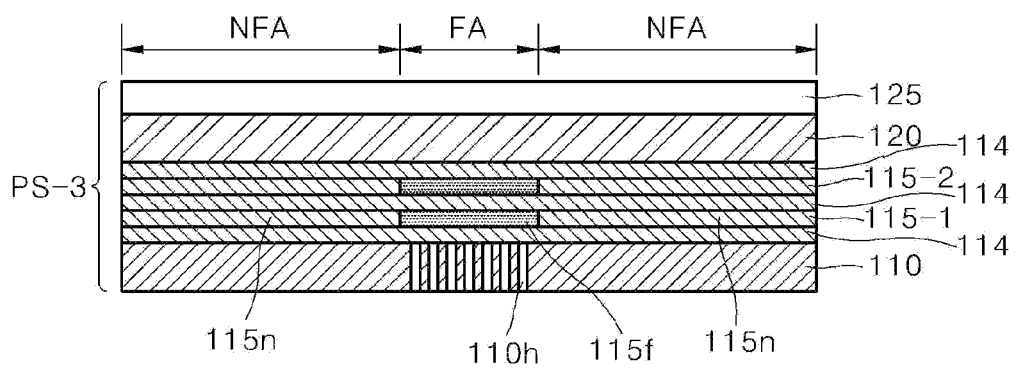
Figure 9:
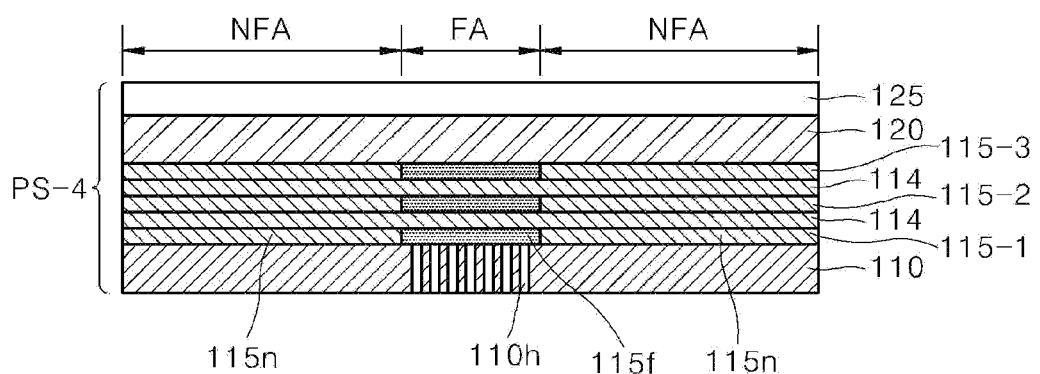

With reference to FIG. 8 and FIG. 9, a support structure PS-3 or PS-4 of the foldable display apparatus may include at least two first adhesive layers 115, wherein each of at least two first adhesive layers 115 has the first portions 115n disposed in the non-foldable areas NFA and the second portion 115f disposed in the foldable area FA and having a degree of cure higher than that of each of the first portions 115n. The support structure PS-3 or PS-4 of the foldable display apparatus may further includes at least two second adhesive layers 114, wherein each of the at least two second adhesive layers 114 is disposed on one surface or the opposite surface of each of the first adhesive layers 115 and has a uniform degree of cure. In the support structure PS-3 shown in the example of FIG. 8, two first adhesive layers 115 and three second adhesive layer 114 may be alternately stacked with each other, and the second adhesive layer 114 may constitute each of the lowermost and uppermost layer. In the support structure PS-3 shown in the example of FIG. 9, three first adhesive layers 115 and two second adhesive layers 114 may be alternately stacked with each other, and the first adhesive layer 115 may constitute each of the lowermost and uppermost layer. The first adhesive layers 115 and the second adhesive layers 114 may be separately manufactured and then be bonded to each other.

In the foldable display apparatus according to an embodiment of the present disclosure, the support structure PS-3 or PS-4 may include the at least two first adhesive layers 115 disposed between the first support plate 110 and the second support plate 120 of the support structure PS-3 or PS-4, wherein each first adhesive layer 115 has the second portion 115f covering the plurality of opening patterns 110h formed in the foldable area of the first support plate 110, and having a greater modulus or higher degree of cure than that of each of the first portions 115n. Thus, the apparatus may have excellent folding characteristics. The display quality defect occurring when the step caused due to the opening patterns of the support structure is transferred to the display face of the foldable display apparatus may be further suppressed. Further, the puncture strength may be further improved in the foldable area.

A foldable display apparatus according to an example embodiment of the present disclosure may be described as follows.

According to an embodiment of the present disclosure, a foldable display apparatus comprises a display panel; a first plate under the display panel; and a support structure under the first plate and having a foldable area and two non-foldable areas respectively on both opposing sides of the foldable area, wherein the support structure includes: a first support plate having a plurality of opening patterns defined in the foldable area of the support structure; a second support plate above the first support plate and including a material different from a material of the first support plate; and a first adhesive layer between the first support plate and the second support plate, wherein the first adhesive layer of the support structure has: first portions respectively in each of the two non-foldable areas of the support structure; and a second portion in the foldable area of the support structure, wherein the second portion has a higher degree of cure than a degree of cure of each of the first portions.

In some embodiments of the present disclosure, the second portion of the first adhesive layer covers all of the plurality of opening patterns of the first support plate.

In some embodiments of the present disclosure, the first support plate includes a metal, and the second support plate includes a polymer that blocks UV rays.

In some embodiments of the present disclosure, the second support plate includes polyethylene terephthalate having a black color.

In some embodiments of the present disclosure, the foldable display apparatus further comprises a second adhesive layer disposed on a surface of the first adhesive layer.

In some embodiments of the present disclosure, the second adhesive layer has a lower degree of cure than a degree of cure of the second portion of the first adhesive layer.

In some embodiments of the present disclosure, the first adhesive layer includes at least two first adhesive layers, and the second adhesive layer includes at least two second adhesive layers, and wherein the at least two first adhesive layers and the at least two second adhesive layers are alternately stacked with each other.

In some embodiments of the present disclosure, the first adhesive layer includes an adhesive layer cured in two different curing schemes selected from among at least one of heat curing, light curing, and moisture curing schemes.

In some embodiments of the present disclosure, the first portions and the second portion of the first adhesive layer are first cured in a first curing scheme selected from among the heat curing, light curing, and moisture curing schemes and then only the second portion is second cured in a second curing scheme different from the first curing scheme and selected from among the heat curing, light curing, and moisture curing schemes.

According to an embodiment of the present disclosure, a foldable display apparatus comprises a display panel; and a plate assembly under the display panel, wherein the plate assembly includes an upper plate, a lower plate under the upper plate, and a first adhesive layer between the upper plate and the lower plate, wherein the lower plate has a plurality of opening patterns defined therein, wherein the first adhesive layer covers the plurality of opening patterns, and has different portions having different moduli.

In some embodiments of the present disclosure, the upper plate includes a polymer blocking ultraviolet rays, and the lower plate includes a metal.

In some embodiments of the present disclosure, the first adhesive layer includes first portions respectively in non-foldable areas and a second portion in a foldable area, wherein the second portion has a higher modulus than a modulus of each of the first portions.

In some embodiments of the present disclosure, the foldable display apparatus further comprises a second adhesive layer disposed on one surface or the other surface of the first adhesive layer.

In some embodiments of the present disclosure, the first adhesive layer includes at least two first adhesive layers, and the second adhesive layer includes at least two second adhesive layers, wherein the at least two first adhesive layers and the at least two second adhesive layers are alternately stacked with each other.

In some embodiments of the present disclosure, all of the different portions of the first adhesive layer are first cured in a first curing scheme selected from among at least one of heat curing, light curing, and moisture curing schemes and then only one of the different portions is second cured in a second curing scheme different from the first curing scheme and selected from among at least one of heat curing, light curing, and moisture curing schemes.

According to an embodiment of the present disclosure, a foldable display apparatus comprises a display panel; a first plate under the display panel; and a support structure under the first plate and having a foldable area and two non-foldable areas respectively on both opposing sides of the foldable area, wherein the support structure includes a first support plate having a plurality of opening patterns defined in the foldable area of the support structure; a second support plate above the first support plate and including a material different from a material of the first support plate; and a first adhesive layer, wherein the first adhesive layer is a single curable type adhesive layer between the first support plate and the second support plate, wherein the first adhesive layer has: first portions respectively in each of the two non-foldable areas of the support structure; and a second portion in the foldable area of the support structure, wherein the second portion has a higher degree of cure than a degree of cure of each of the first portions, wherein the first portions and the second portion of the first adhesive layer are first cured under light and then only the second portion is further cured under light.

In some embodiments of the present disclosure, a first spacing between the opening patterns adjacent to each other in the direction perpendicular to a folding axis of the foldable area in a central portion adjacent to the folding axis is smaller than a second spacing between the opening patterns adjacent to each other in the direction perpendicular to the folding axis in an edge portion on either side of the central portion.

It will be apparent to those skilled in the art that various modifications and variations can be made in the foldable display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A foldable display apparatus, comprising:
   a display panel;
   a first plate under the display panel; and
   a support structure under the first plate and having a foldable area and two non-foldable areas respectively on both opposing sides of the foldable area,
   wherein the support structure includes:
      a first support plate having a plurality of opening patterns defined in the foldable area of the support structure;
      a second support plate above the first support plate and including a material different from a material of the first support plate; and
      a first adhesive layer between the first support plate and the second support plate,
   wherein the first adhesive layer of the support structure has:
      first portions respectively in each of the two non-foldable areas of the support structure; and
      a second portion in the foldable area of the support structure, wherein a material of the second portion has a higher degree of cure than a degree of cure of a material of each of the first portions.

2. The foldable display apparatus of claim 1, wherein the second portion of the first adhesive layer covers all of the plurality of opening patterns of the first support plate.

3. The foldable display apparatus of claim 1, wherein the first support plate includes a metal, and the second support plate includes a polymer blocking UV rays.

4. The foldable display apparatus of claim 3, wherein the second support plate includes polyethylene terephthalate having a black color.

5. The foldable display apparatus of claim 1, further comprising a second adhesive layer disposed on a surface of the first adhesive layer.

6. The foldable display apparatus of claim 5, wherein the second adhesive layer has a lower degree of cure than a degree of cure of the second portion of the first adhesive layer.

7. The foldable display apparatus of claim 5, wherein the first adhesive layer includes at least two first adhesive layers, and the second adhesive layer includes at least two second adhesive layers, and
   wherein the at least two first adhesive layers and the at least two second adhesive layers are alternately stacked with each other.

8. The foldable display apparatus of claim 1, wherein the first adhesive layer includes an adhesive layer cured in two different curing schemes selected from among at least one of heat curing, light curing, and moisture curing schemes.

9. The foldable display apparatus of claim 1, wherein the first portions and the second portion of the first adhesive layer are first cured in a first curing scheme selected from among the heat curing, light curing, and moisture curing schemes and then only the second portion is second cured in a second curing scheme different from the first curing scheme and selected from among the heat curing, light curing, and moisture curing schemes.

10. A foldable display apparatus, comprising:
a display panel; and
a plate assembly under the display panel, the plate assembly defining a foldable area and to non-foldable areas respectively on opposing sides of the foldable area, wherein the plate assembly includes an upper plate, a lower plate under the upper plate, and a first adhesive layer between the upper plate and the lower plate,
wherein the lower plate has a plurality of opening patterns defined therein,
wherein the first adhesive layer covers the plurality of opening patterns,
wherein a material of a second portion of the first adhesive layer corresponding to the foldable area has a different modulus than a material of first portions of the first adhesive layer corresponding to the non-foldable areas.

11. The foldable display apparatus of claim 10, wherein the upper plate includes a polymer blocking ultraviolet rays, and the lower plate includes a metal.

12. The foldable display apparatus of claim 10, wherein the material of the second portion has a higher modulus than a modulus of the material of each of the first portions.

13. The foldable display apparatus of claim 10, further comprising a second adhesive layer on a surface of the first adhesive layer.

14. The foldable display apparatus of claim 13, wherein the first adhesive layer includes at least two first adhesive layers, and the second adhesive layer includes at least two second adhesive layers, and
wherein the at least two first adhesive layers and the at least two second adhesive layers are alternately stacked with each other.

15. The foldable display apparatus of claim 10, wherein all of the different portions of the first adhesive layer are first cured in a first curing scheme selected from among at least one of heat curing, light curing, and moisture curing schemes and then only one of the different portions is second cured in a second curing scheme different from the first curing scheme and selected from among at least one of heat curing, light curing, and moisture curing schemes.

16. A foldable display apparatus, comprising:
a display panel;
a first plate under the display panel; and
a support structure under the first plate and having a foldable area and two non-foldable areas respectively on both opposing sides of the foldable area,
wherein the support structure includes:
a first support plate having a plurality of opening patterns defined in the foldable area of the support structure;
a second support plate above the first support plate and including a material different from a material of the first support plate; and
a first adhesive layer, wherein the first adhesive layer is a single curable type adhesive layer between the first support plate and the second support plate,
wherein the first adhesive layer has:
first portions respectively in each of the two non-foldable areas of the support structure; and
a second portion in the foldable area of the support structure, wherein the second portion has a higher degree of cure than a degree of cure of each of the first portions,
wherein the first portions and the second portion of the first adhesive layer are first cured under light and then only the second portion is further cured under light.

17. The foldable display apparatus of claim 16, wherein a first spacing between the opening patterns adjacent to each other in the direction perpendicular to a folding axis of the foldable area in a central portion adjacent to the folding axis is smaller than a second spacing between the opening patterns adjacent to each other in the direction perpendicular to the folding axis in an edge portion on either side of the central portion.

18. The foldable display apparatus of claim 1, wherein the second support plate blocks UV rays.

19. The foldable display apparatus of claim 1, wherein the material of the second portion has a higher modulus than a modulus of the material of each of the first portions.

20. The foldable display apparatus of claim 10, wherein the upper plate blocks ultraviolet rays.

* * * * *